(12) United States Patent
Johannisson et al.

(10) Patent No.: US 6,792,251 B2
(45) Date of Patent: *Sep. 14, 2004

(54) ARRANGEMENT AND METHOD FOR IMPROVING MULTI-CARRIER POWER AMPLIFIER EFFICIENCY

(75) Inventors: Björn Johannisson, Kungsbacka (SE); Jarek Luberek, Göteborg (SE)

(73) Assignee: Telefonaktiebolaget LM Ericsson (publ), Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,719

(22) Filed: Jul. 9, 1999

(65) Prior Publication Data

US 2002/0168949 A1 Nov. 14, 2002

(30) Foreign Application Priority Data

Jul. 10, 1998 (SE) .............................................. 9802498

(51) Int. Cl.$^7$ .............................................. H04Q 11/12
(52) U.S. Cl. .................. 455/126; 455/127.1; 455/115.1; 330/149
(58) Field of Search ........................... 455/114.1, 115.1, 455/63.1, 67.1, 69, 101, 111, 117, 119; 330/52, 129, 124 R, 149, 151

(56) References Cited

U.S. PATENT DOCUMENTS

| | | | | |
|---|---|---|---|---|
| 5,241,687 A | * | 8/1993 | Short ........................... | 455/45 |
| 5,323,119 A | * | 6/1994 | Powell et al. ................ | 330/151 |
| 5,861,844 A | * | 1/1999 | Gilmore et al. ............. | 342/374 |
| 5,862,459 A | * | 1/1999 | Charas ........................ | 455/114 |
| 5,920,286 A | * | 7/1999 | Mohebbi ..................... | 342/383 |
| 6,226,531 B1 | * | 5/2001 | Holt et al. ................... | 455/562 |
| 6,255,903 B1 | * | 7/2001 | Leffel ........................... | 330/51 |
| 6,259,320 B1 | * | 7/2001 | Valk et al. ................... | 330/149 |
| 6,275,685 B1 | * | 8/2001 | Wessel et al. ............... | 455/126 |
| 6,320,540 B1 | * | 11/2001 | Meredith ..................... | 342/377 |
| 6,344,810 B2 | * | 2/2002 | Velazquez ................... | 341/118 |
| 6,397,082 B1 | * | 5/2002 | Searle ......................... | 455/562 |

* cited by examiner

Primary Examiner—Tilahun Gesesse

(57) ABSTRACT

A multi-carrier power amplifying arrangement has a number of amplifying devices, each of which includes a main amplifier and a linearizing device. Furthermore it includes a device signal for adding the adding output signals from the amplifying devices in phase, a device for detecting the average phase error of the amplified signals and for providing a compensating control signal. The compensating control signal is provided to each amplifying device at least to compensate for the average phase error.

31 Claims, 7 Drawing Sheets

ARRANGEMENT AND METHOD FOR IMPROVING MULTI-CARRIER POWER AMPLIFIER EFFICIENCY

This application claims priority under 35 U.S.C. §§119 and/or 365 to Application No. 9802498-7 filed in Sweden on Jul. 10, 1998; the entire content of which is hereby incorporated by reference.

BACKGROUND

The present invention relates to a multi-carrier power amplifying arrangement and to a method of controlling at least the average phase error of a multi-carrier power amplifying arrangement. The invention also relates to an array antenna with an amplifying arrangement. Particularly the invention relates to minimizing radiated power intensity for intermodulation products.

In cellular mobile communication systems the geographical coverage area of a mobile communication network is divided into cells. For each of these cells a stationary base station is arranged to communicate with a plurality of mobile stations. Each base station (BS) is connected to an antenna, or a set of antennas, covering the cell in which the BS is arranged. This means that a base station on the downlink transmits in such a manner that all mobile stations within the cell can receive the signal. Most of the transmitted information is, however, point-to-point information intended for one single mobile station only. Most of the RF power will thus be transmitted in directions in which no transceiver will receive it. If the base station could concentrate the transmitted power vertically as well as horizontally to the desired directions, using antennas with radiation patterns characterized through narrow antenna lobes, a higher efficiency could be achieved.

If the same kind of antennas are used for reception in the base station as well (on the uplink), a corresponding improvement of the reception sensitivity is obtained in the desired directions. This concentration of the output power and the reception sensitivity can be used for increasing the transmission range or for lowering the requirements on the transmitter in the base station as well as on the transmitter in the mobile station. Since the channel frequency reuse potentially can be increased with this technique, the total capacity of the mobile communication network can be enhanced. These and other advantages have in the last few years resulted in a growing interest in antenna arrays with narrow antenna beams.

It is well known in the art that all amplifiers distort an input signal. The distortion becomes greater as the power levels are increased. When the amplifier is exposed to multiple input signals, intermodulation (IM) products are introduced. These IM products must be kept low because they interfere with the system in general and with other users in particular.

Current cellular communication standards impose stringent limits on radiated power intensity for intermodulation products. The use of a central multi-carrier power amplifier (MCPA), as in current mobile communication cellular systems, suffers from a disadvantage in this respect since not only the desired signal, but also the intermodulation products will be amplified/enchanced. The consequence thereof, in combination with the power requirements on the single multi-carrier amplifier, will be that the single multi-carrier amplifier needs to employ rather sophisticated techniques to reach the desired limits on the carrier to intermodulation ratio (C/I-ratio).

Since the amount of linearisation that can be provided is technologically limited, a central amplifier has to use a significant amount of back-off to reach the desired levels of intermodulation. This leads to a decreased efficiency which in turn results in a low DC to RF conversion efficiency.

In the article "Application of Linearised Amplifiers in Adaptive Antennas" by Hongxi et al, published in the IEEE MTT-S 1995 International Topical Symposium on Technologies for Wireless applications, and in which the use of adaptive antenna arrays for future mobile communication systems is discussed, a linearisation technique called feed-forward technique is proposed as the most suitable approach for suppression of intermodulation in the base stations.

The feed-forward technique, which has been applied for linearisation of a central multi-carrier power amplifier (MCPA) basically consists of two independent steps. The first step is to extract the distortion introduced by the main amplifier by comparing the amplified signal with the input signal. This step is referred to as extracting an error signal. The second step is to amplify this error signal and inject it in anti-phase and time aligned at the output of the feed-forward amplifier to thereby cancel out the distortion.

The performance of the feed-forward technique is dependent on the ability to add rotated signal vectors correctly in anti-phase and equal amplitude. This process determines how well a distortion component can be extracted or suppressed. The ability to control these variables, i.e., gain and phase, are therefore of crucial importance in feed-forward amplifier systems. Hence, phase and amplitude adapters are employed. These adapters for a given environment can be tuned to give a minimum of phase and amplitude error. However, due to, e.g., temperature drift, an imbalance may occur, resulting in insufficient intermodulation suppression. For this reason, the general feed forward linearisation method is normally combined with an adaptive phase/amplitude control.

There are two main methods of how to implement this. The first method uses the actual distortion caused by the main amplifier to control the settings of the gain and phase controls. This is possible since it equals the first step in the feed-forward process. In this case, the error signal content is minimized at the output. The second method uses a known distortion simulating signal which is injected in the amplifier path and minimized at the output, thereby also reducing the distortion introduced by the main amplifier. The term distortion shall be understood to mean any signals present in the output of a device which were not present at the input.

U.S. Pat. No. 5,386,198 discloses an example of a method of the second type for controlling a feed-forward compensated power amplifier. A spread spectrum technique is used to cover a control signal(s) and injects a composite signal at a suitable point into the feed-forward amplifier system to reduce distortion. Control signals after remapping of the spread spectrum at the output of the system are correlated in a match filter correlator and the result is used to control, in either polar or Cartesian co-ordinates, the injection, in anti-phase, of the extracted distortion into the feed forward amplifier output.

It is a drawback that the requirements as to linearisation of each amplifying means are too high and difficult, if not impossible, to meet in order to reach an acceptable carrier to intermodulation ratio (C/I-ratio).

It is particularly disadvantageous that the average phase error may be high and particularly it is disadvantageous that, when the conditions change, for example as compared to a first situation in which for a given temperature, the used control circuitry is tuned to give a zero average phase and amplitude error, the average phase error will increase considerably as for example the temperature changes (even if temperature compensated circuits are used). The average phase error will also increase considerably for high antenna gains and the limits as to the maximum allowed intermodulation intensity may easily be exceeded. It is also substantially impossible to detect and remove a resulting average phase error using the hitherto known arrangements and methods.

SUMMARY

What is needed is therefore an amplifying arrangement, particularly a multi-carrier arrangement, through which the radiated power intensity of intermodulation products can be kept low in a simple and efficient manner. Particularly an arrangement is needed in which the requirements as to linearization are low on the respective amplifying means forming the amplifying arrangement, particularly lower than in hitherto known arrangements. An arrangement is also needed through which the power of intermodulation products can be kept low irrespectively of whether the conditions change in relation to any initial conditions, or generally under varying conditions and for a high antenna gain etc. Particularly an arrangement is needed through which at least the average phase error (and advantageously also the amplitude error) can be detected and controlled or compensated for.

Particularly an arrangement is needed which is flexible, uncomplicated and easy to fabricate. An array antenna with such an arrangement is also needed through which the abovementioned objects are achieved as well as a method of controlling an amplifying arrangement or more particularly an active array antenna.

Therefore a multi-carrier power amplifying arrangement is provided. It comprises a number of amplifying means each comprising signal input means, signal output means, a main amplifier and means for linearizing the amplifying means. Furthermore signal adding means are provided for adding the output signals from the amplifying means in phase. Error detecting means are provided for detecting the average phase error of the amplified sum signal and for providing a compensating control signal. The compensating control signal is provided to each amplifying means to compensate for the average phase error. In a particular embodiment a reference signal is provided to each amplifying means, which reference signal is used to detect the average phase error of the sum of the amplified signals in the error detecting means. Still more particularly the reference signal may consist of a pilot signal which is input to each of the amplifying means and to the error detecting means. The error detecting means consists of means for detecting the signal level of at least one component originating from the pilot signal and the result is used in providing the compensating control signal. In a particular embodiment an externally controlled signal is provided to the error detecting means to provide the compensating control signal.

In a particular embodiment the linearizing means consist of a number of feed forward loops, one for each amplifying means. Of course also other linearizing means can be used. In for example U.S. Pat. Nos. 5,051,704, 5,323,119, 5,116, 634, 5,148,117, 5,148,117, 4,560,945, all of which allow external biasing, linearizing techniques are disclosed all of which in principle can be used to linearize the individual amplifying means as disclosed in the present invention.

Feed-forward loops implemented for linearization of distributed MCPA's may decrease the non-linearities with, e.g., 30 dB. The reamining non-linear terms will have a random phase and amplitude. For any given temperature, the control circuitry can initially be tuned to yield zero average phase and amplitude error. Adaptive control circuits can be used to suppress temperature drift, but since there is a lowest detectable amplitude for the detection circuits in adaptive control circuits and since these circuits themselves are impaired with a temperature dependence, the average error may deviate from zero. This non-zero average value will be enchanced by the antenna gain and might for large antenna gains exceed the limits for allowed emitted intermodulation intensity.

Distributed multi-carrier amplifiers according to the present invention provide new possibilities of designing communication system antennas with stringent constraints on radiated intermodulation intensity. With a distributed multi-carrier power amplifier the linearization requirements on each module, or each amplifying means, are reduced as compared to the case in which a central multi-carrier power amplifier is used. The lower linearity requirements will provide a higher efficiency in the multi-carrier power amplifying arrangement due to a lower back-off in the main amplifiers. As an example, for four carriers the usual 5–8% efficiency with 30 dB C/I can be increased to about 15–20% if 20 dB C/I is allowed instead.

In a particular implementation of the invention each of the signals output from the respective amplifying means, i.e. the amplified signals, are provided to (at least one) antenna element, which antenna elements are arranged to form an array antenna. The antenna elements may be arranged in a linear array or alternatively they may be arranged in a two-dimensional array, usually planar.

As to the compensating control signal it is particularly a signal with an externally controlled phase, even more particularly, the externally controlled signal is provided to the error detecting means via a digitally controlled phase shifter. This is however not necessary and particularly the phase shifter does not have to be digitally controlled.

In one particular embodiment the entire arrangement may be realized as an RF-ASIC (Radio Frequency-Application Specific Integrated Circuit).

According to different implementations, in case a reference signal is used or even more particularly a pilot signal, such signal may be injected either before the main amplifier of each amplifying means or after the main amplifier of each amplifying means.

In a particular implementation the error detecting means includes a phase detector and an amplitude detector.

For an antenna in a matrix form the antenna elements are particularly arranged in m rows and n columns and for the antenna elements a number of amplifying means are arranged, e.g. in a similar manner. The signal output from an amplifying arrangement can be provided to one or more antenna elements.

The adding means particularly include n/m first adding means in which the output signals from the amplifying means are added in phase columnwise/rowwise and in a Butler matrix, here denoted a, second Butler matrix for reasons as will be explained below, the sum signals from the m or n first adding means respectively are added. In such an embodiment a first switching means and a first Butler matrix are provided for selecting an input beam with one of a number of different phases, for each phase a number of amplifying means and antenna elements being provided. To the second Butler matrix as referred to above a second switching means is provided for selecting output beam. In a particular implementation of the embodiment as described above, means are provided for finding the minimum of the signal output from the second switching means. Said minimum is particularly found through using varying external control signals and the result is used to provide the compensating control signal which in turn is provided to each of the amplifying means as discussed earlier.

Therefore is also an array antenna provided which includes a number of antenna elements, to which antenna elements a number of amplifying means are provided, in which an input signal is amplified and provided to one or more antenna elements. Each of the amplifying means include a main amplifier and means for linearizing the amplifying means respectively. Signal adding means are provided for adding the amplified signals output from the amplifying means in phase (coherently) and error detecting means are provided for detecting the average phase error (and amplitude error) of the amplfied signals and for providing a compensating control signal. The compensating control signal is provided to each one of the amplifying means to control/minimize the average phase error of the amplified signals input to the antenna means. In an advantageous implementation a pilot signal is input to each amplifying means which then is detected in the error detecting means to provide an estimation of the average phase error of the sum of the amplified signals. Particularly the signal level of the, or at least one, component originating from the pilot signal output from the amplifying means is detected. The pilot signal may be (a) specific frequency component(s) or alternatively it can be a spread spectrum or CDMA—(Code Division Multiple Access) coded signal. In a particular implementation a signal with an externally controlled phase is provided to the error detecting means to provide the compensating control signal. The antenna elements may be arranged in a linear array or in a two dimensional array. Amplifying means are arranged in m rows and n columns. At least as many antenna elements as amplifying means are provided, e.g. in a similar manner. For each column or for each row adding means are provided in which the amplified signals are added vertically or horizontally. The resulting sum signals from either thereof are then added together in a Butler matrix. A switch is advantageously provided to select one of the beams output from the Butler matrix. Furthermore means are provided for finding the minimum of the selected output beam using a varying external control signal. The resulting average value is used to control the amplifying means.

Therefore also a method is provided for controlling at least the average phase error of a multi-carrier power amplifying arrangement for an array antenna. The amplifying arrangement includes a number of amplifying means, each providing an amplified signal to at least one antenna element of the array antenna. The method includes the steps of: providing an input signal to each of the amplifying means, adding the amplfied signals output from the respective amplifying means to generate a number of sum signals, detecting the averge phase error of the sum signal(s), and using the detected average phase error to provide a compensating control signal. The compensating control signal is then provided to each amplifying means to control/minimize at least the average phase. error. Advantageously is also the amplitude error compensated for. In a particular implementation the array antenna comprises a two dimensional array antenna and the output signals from the amplifying means are added in a number of adding means, one for each column, vertically, whereafter a Butler matrix is used in which the vertically added sum signals are added. A signal output from the Butler matrix is selected with switching means. All signals are added to find an average value, which is a scalar (real or complex) value.

BRIEF DESCRIPTION OF THE DRAWINGS

The invention will in the following be further described, in a non-limiting way and with reference to the accompanying drawings, in which.

DETAILED DESCRIPTION

Figure 1:
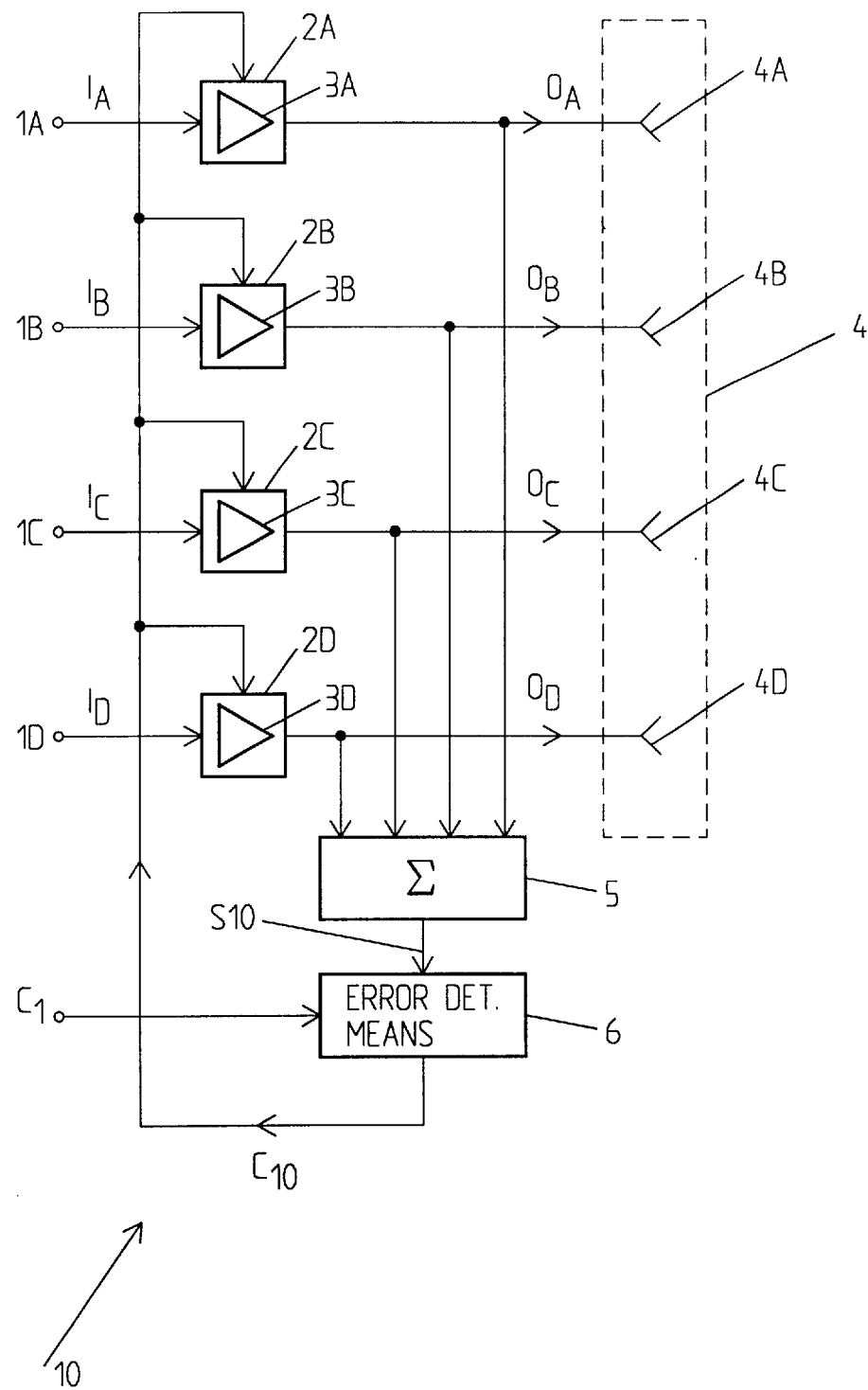
FIG. 1 shows a first embodiment of the invention with a number of amplifying means providing amplified signals to a number of antenna elements arranged in a linear array.

FIG. 1 shows a first embodiment of the invention of a distributed multi-carrier amplifying arrangement 10 including four amplifying means 2A, 2B, 2C, 2D. Each amplifying means 2A, 2B, 2C, 2D includes a main amplifier 3A, 3B, 3C, 3D and via input means 1A, 1B, 1C, 1D input signals $I_A$, $I_B$, $I_C$ and $I_D$ are provided to the amplifying means 2A, 2B, 2C, 2D. Although each amplifying means includes linearizing means, these are not explicitly illustrated in this figure. As referred to earlier in the description the invention is not limited to any particular kind of linearizing means. Each amplifying means in a distributed arrangement need not be as linear as a central multi-carrier power amplifier but the average phase and amplitude error has to be controlled to the same extent or with the same precision as in a central multi-carrier power amplifier. According to the invention it is possible to control the average performance of the distributed amplifying means by adding the signals output from all the amplifying means, or particularly amplifier modules, in phase and make a correction compensation in each one of the amplifying means. Thus, the amplified signals $O_A$, $O_B$, $O_C$, $O_D$ are input to signal adding means 5 thus providing a sum signal S10. The adding of the signals is done coherently, i.e. the signals are added in phase. The sum signal S10 is then input to error detecting means 6 in which the phase error is detected. That can be done in different ways and using the result of the error detection a compensating control signal $C_{10}$ is obtained. Particularly an external control signal $C_1$ may be input to the error detecting means assisting in providing the compensating control signal $C_{10}$. This compensating control signal $C_{10}$ is then input to each one of the amplifying means 2A, 2B, 2C, 2D. To remove the average phase error an external control reference phase in each one of the amplifying means is used to provide an external bias. One way of providing this is through adding a phase shifter which particularly may be digitally controlled for adding external control signal $C_1$. In that manner it is possible to make the phase detection believe that there is a phase error and compensate for it. As the same compensating signal is added to the amplifying means, the common average can be removed.

According to the present invention the IM signal in the boresight beam direction is not allowed to increase due to uncontrolled average amplifier phase error. An additional advantage of adding the signals output from all the amplifying means before intermodulation detection or error detection, is that the signal level increases which makes it easier to get a good accuracy and to compensate for the inter-modulation products or the error. Thus, compensated output signals $O_A$, $O_B$, $O_C$, $O_D$ are obtained which are input to antenna elements 4A, 4B, 4C, 4D of a linear array antenna 4.

Figure 2:
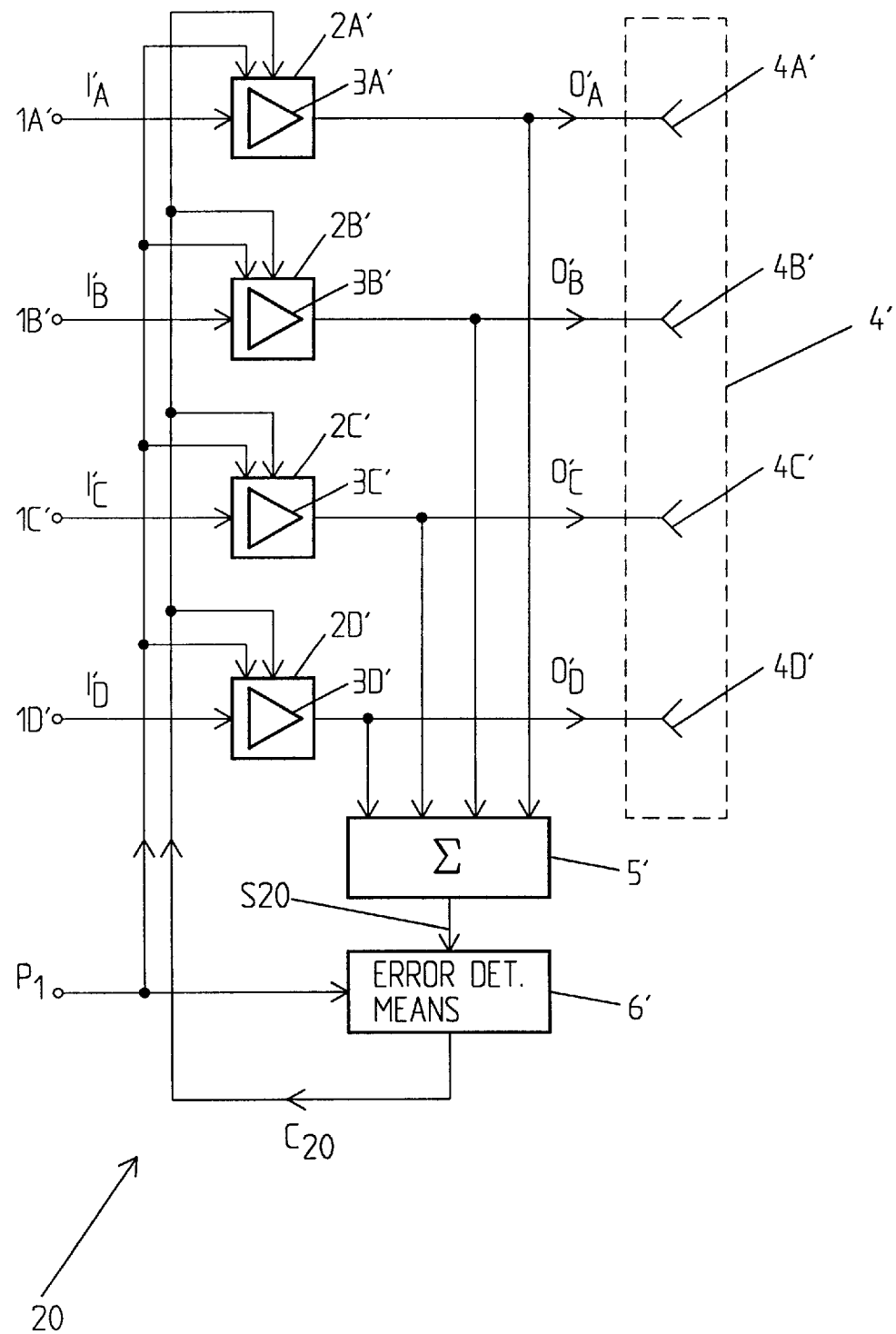
FIG. 2 is a second embodiment of an amplifying arrangement according the invention.

In FIG. 2 an alternative embodiment of a multi-carrier power amplifying arrangement 20 is illustrated. Like in FIG. 1 it comprises four amplifying means 2A', 2B', 2C', 2D', each with signal input means 1A', 1B', 1C', 1D' and signal output means. Also similar to the embodiment of FIG. 1 each amplifying means contains a main amplifier 3A', 3B', 3C', 3D'. Thus input signals $I_A'$, $I_B'$, $I_C'$ and $I_D'$ are amplified in the respective amplifying means forming amplified output signals $O_A'$, $O_B'$, $O_C'$, $O_D'$ which are provided to adding means 5' in which they are added in phase thus providing an output signal S20. The sum signal S20 is input to error detecting means 6'. In this embodiment, however, a reference signal, or here particularly a pilot signal $P_1$ is input to each one of the amplifying means $2_A'$, $2_B'$, $2_C'$, $2_D'$ and in the error detecting means 6' a pilot signal detection is carried out, which here means that a frequency component of the pilot signal is detected. In an alternative embodiment the pilot signal may however be CDMA-coded. For error detecting the pilot signal can also be input to the error detecting means 6'. The pilot signal $P_1$ is injected before or after the respective main amplifiers and it will show up in the coherent summation and will be detected in the error detecting means 6'. According to the invention the IM-signal in the boresight beam direction is not allowed to increase due to uncontrolled average amplifier phase error as discussed above. Since there is only one input signal to the pilot detecting means 6' and one output signal from the error detecting means 6', the pilot detection will only have to perform a one-dimensional search to find the minimum pilot level. This can e.g. be done through varying the voltage which in turn controls the phase. A local minimum can then be found. Thus a compensating control signal $C_{20}$ is provided which is input to all the amplifying means 2A', 2B', 2C', 2D' and in this manner compensated output signals are then input to the antenna elements 4A', 4B', 4C', 4D' consituting a linear array antenna 4'. Also in this case the linearizing means may be of any appropriate kind.

Although the number of antenna elements are illustrated as being the same as the number of amplifying means, this does not have to be the case. There may also be more antenna elements than amplifying means. For example might the outer amplifying means 2A', 2D' provide amplified signals to more antenna elements than 4A', 4D' which however not are shown. Of course also other alternatives are possible.

Figure 3:
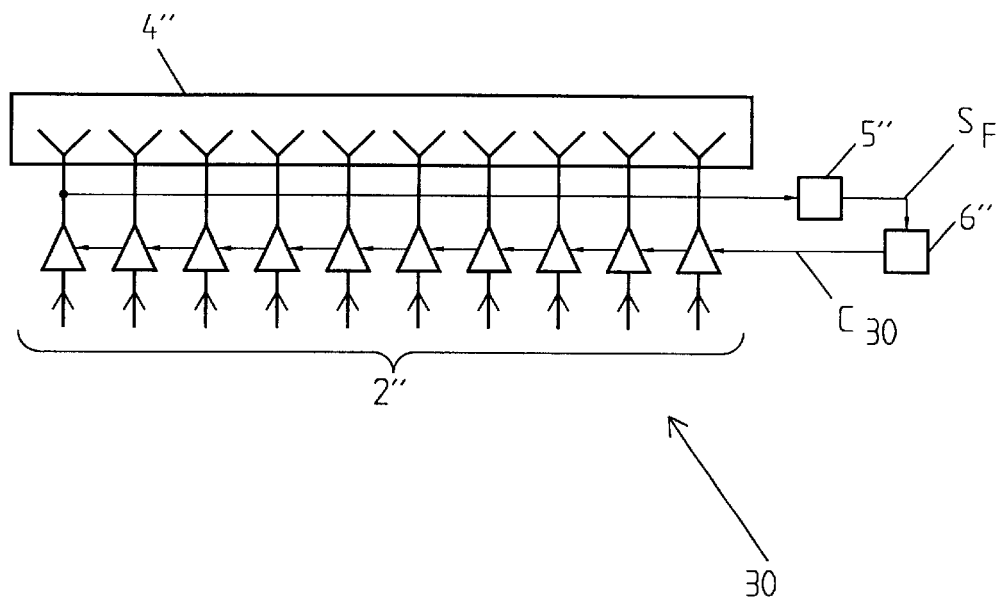
FIG. 3 is a simplified view of a linear array of antenna elements and amplifying means.

FIG. 3 schematically illustrates a linear array of antenna elements 4'' to each of which an amplifying means is provided (there may be more antenna elements as discussed above), here indicated through amplifying arrangement 2''. As in the preceding embodiments the output signals from the respective amplifying means are added in phase in adding means 5'' thus providing a sum signal $S_f$ which is input to pilot detecting means 6''. (The pilot signal input to the respective amplifying means is however not illustrated in this Figure.) An externally controlled phase shifter (not shown) is used to provide a compensating control signal $C_{30}$ which is input to each of the amplifying means of the amplifying arrangement 2''. The same compensating control signal $C_{30}$ is added to all the amplifying means and the common average can be removed. Thus the IM-signal in the boresight beam direction is not allowed to increase due to uncontrolled average emplifier phase error. Since there is only one input signal and one output signal, the pilot detection will only have to perform a onedimensional search to find the minimum pilot level. It is also an advantage that all the signals output from the amplifying means are added before intermodulation detection since the signal level increases which in turn makes it easier to get a good accuracy and to compensate for it as discussed above.

Figure 4:
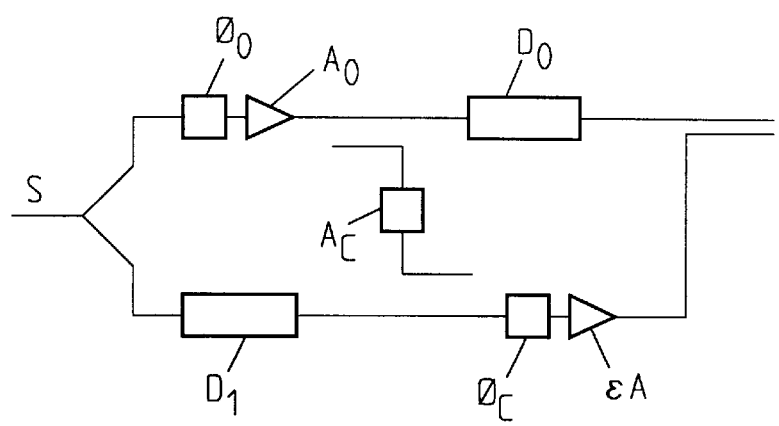
FIG. 4 is a simplified illustration of a feed-forward amplifier that can be used for linearization purposes.

FIG. 4 schematically illustrates an adaptive feed-forward amplifier including one example on linearizing means that can be used to achieve amplified signal linearity. Using this technique, two signal paths are used, one (the upper) that provides the power amplification and the other which is a copy or a reference of the original signal which is used to correct the non-linearities created in the first signal path. The phase shifters $\Phi_0$ and $\Phi_C$ and the attenuator $A_C$ are controlled by additional circuity not shown i FIG. 4. Also illustrated are a power divider and delay lines $D_0$, $D_1$. Since the right loop of the circuit will decrease the non-linearities about 25–35 dB, the remaining non-linear terms will, for an ensemble of amplifiers, have a random phase and amplitude. This feature can be used to avoid that non-linear terms are enhanced by the antenna gain resulting in an even spatial spread of intermodulation radiation. As referred to earlier, for any given temperature the control circuitry initally can be tuned to give zero average phase and amplitude error. However, as the conditions change, this will not be sufficient even if temperature compensated circuits are used and for large antenna gains (e.g. planar arrays) the produced non-zero average value will be enhanced considerably by the array gain and exceed the limits for the allowed emitted intermodulation intensity. Presumably such radiation will be emitted at boresight since it can be suggested that the components have the same temperature dependence. However, the linearizing means as discussed above can be used in combination with the inventive concept to remove the average phase error.

Figure 5:
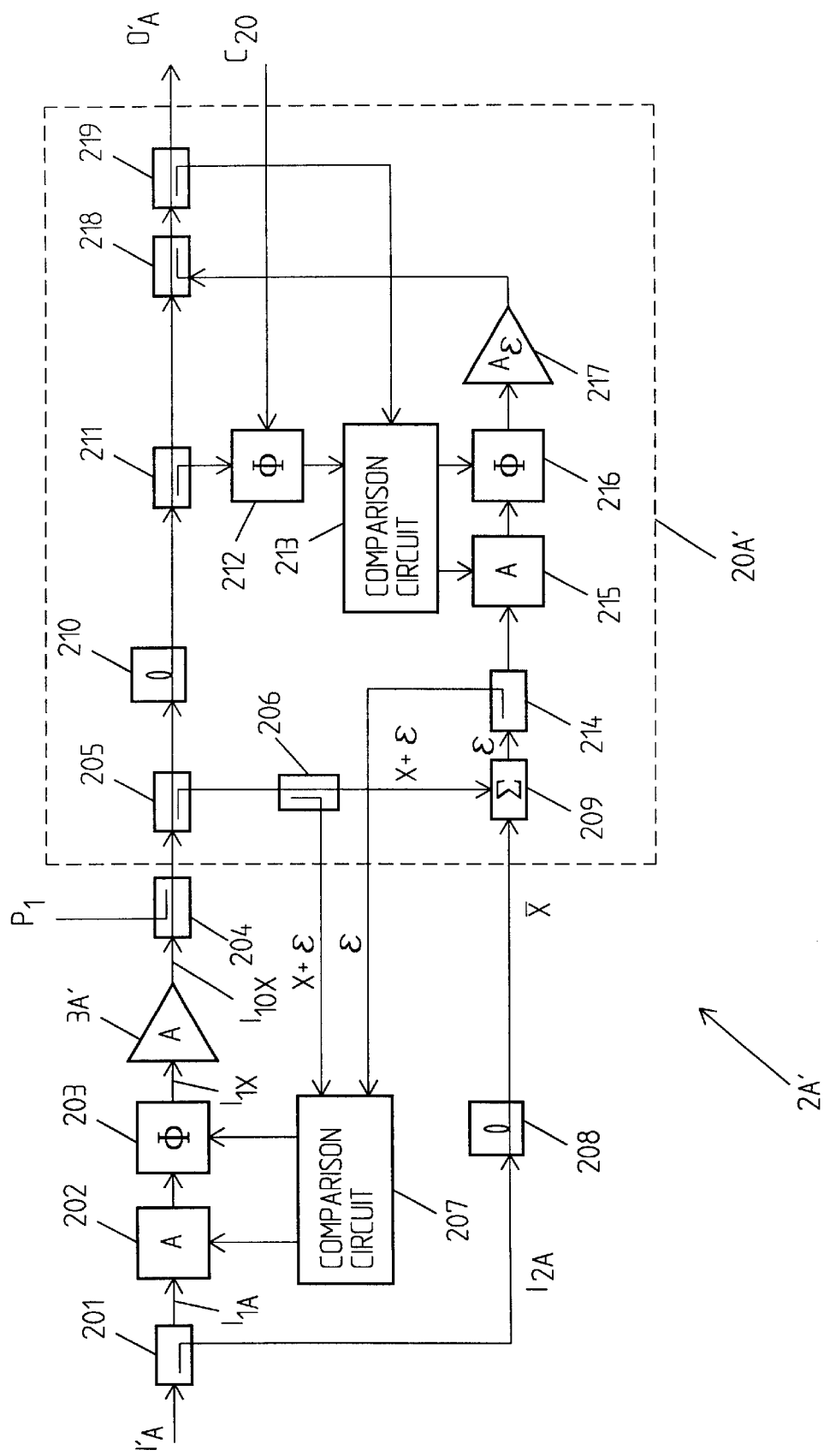
FIG. 5 shows an example of an amplifying means of FIG. 2 more in detail.

FIG. 5 shows more in detail the amplifying means 2A' of FIG. 2. Like in FIG. 2 $I_A'$ illustrates the signal input to amplifying, means 2A'. In power divider 201 the input signal $I_A'$ is duplicated. One part of the input signal $I_A'$, i.e. $I_{1A}$ is via amplitude control means 202 and phase control means 203 giving a signal $I_{1x}$ which is provided to the main amplifier 3A' providing a signal $I_{10x}$ which is provided to directional coupler and combiner 204 to which also a pilot signal P1 also is input. Amplitude and phase control means 202, 203 adjust the phase and amplitude of $I_{1A}$ to provide an adjusted input signal $I_{1x}$. In dividing means 205 $I_{10x}$+P1 is duplicated (it contains the linearly distorted input signal and new frequency components caused by the non-linearity of the main amplifier 3A') and the signal is sent on to divider 206 from which the duplicated signals are sent to the comparison circuit 207; the signal is here denoted x+ε (meaning the input signal as amplified plus the pilot signal and the produced error (ε)) and to adding means 209 (the signal also here is x+ε).

In comparing means 207 the signal is used to control phase and amplitude control means 203, 202. The second input signal $I_{2A}$ is via delay means 208 sent to combining means 209. The adding means 209 may either consist of subtracting means so that a signal x+ϵ is reduced by the signal $I_{2A}$, also called x, thus providing the resulting signal ϵ. Alternatively means may be provided (not shown) to give the duplicated signals $I_{1A}$ and $I_{2A}$ opposite signs in which case $I_{2A}$ is denoted $\bar{x}$. (This can also be provided for by power divider 201.) In that case the adding means 209a are adding means within the proper meaning of the term. In delay means 208 the input signal $I_{2A}$ (or $\bar{x}$) is delayed for a time period that the equals the delay introduced in the opposite path, i.e. the path for input signal $I_{1A}$. In power splitting means 214 ϵ is duplicated and one of the signals is provided to the comparison circuit 207 (as referred to above) whereas the other duplicated signal ϵ is provided to amplitude control means 215 and phase control means 216 thus providing an adjusted error signal which is input to error amplifier 217.

The other path of the signal resulting from combining means 204, i.e. $I_{10x}P_1$, is provided to delay means 210 and to directional coupling means 211 from which one of the duplicated signals is provided to combining means 218 in which a signal is combined with the adjusted error signal output from error amplifier 217. The signal output from combining means 218 is provided to a combiner 219 from which the output signal $O_A'$ is obtained. The duplicated output signal from combiner 219 is provided to the comparison circuit 213.

The duplicated signal obtained from power divider 211 is input to phase control means 212 to which an external control signal $C_{20}$ is input and the resulting signal is provided to the comparison circuit 213 in which it is compared with the signal $O_A'$ to control the amplitude control means 215 and the phase control means 216 acting on the error signal ϵ to be input to the error amplifier 217.

Although this was illustrated with reference to the amplifying means $2_A'$, it should be clear that the same applies for the other amplifying means 2B', 2C', 2D'.

It should however be clear that other kinds of linearizing means 20A' also can be used and the inventive concept thus by no means relies on the use of any particular linearizing means.

Figure 6:
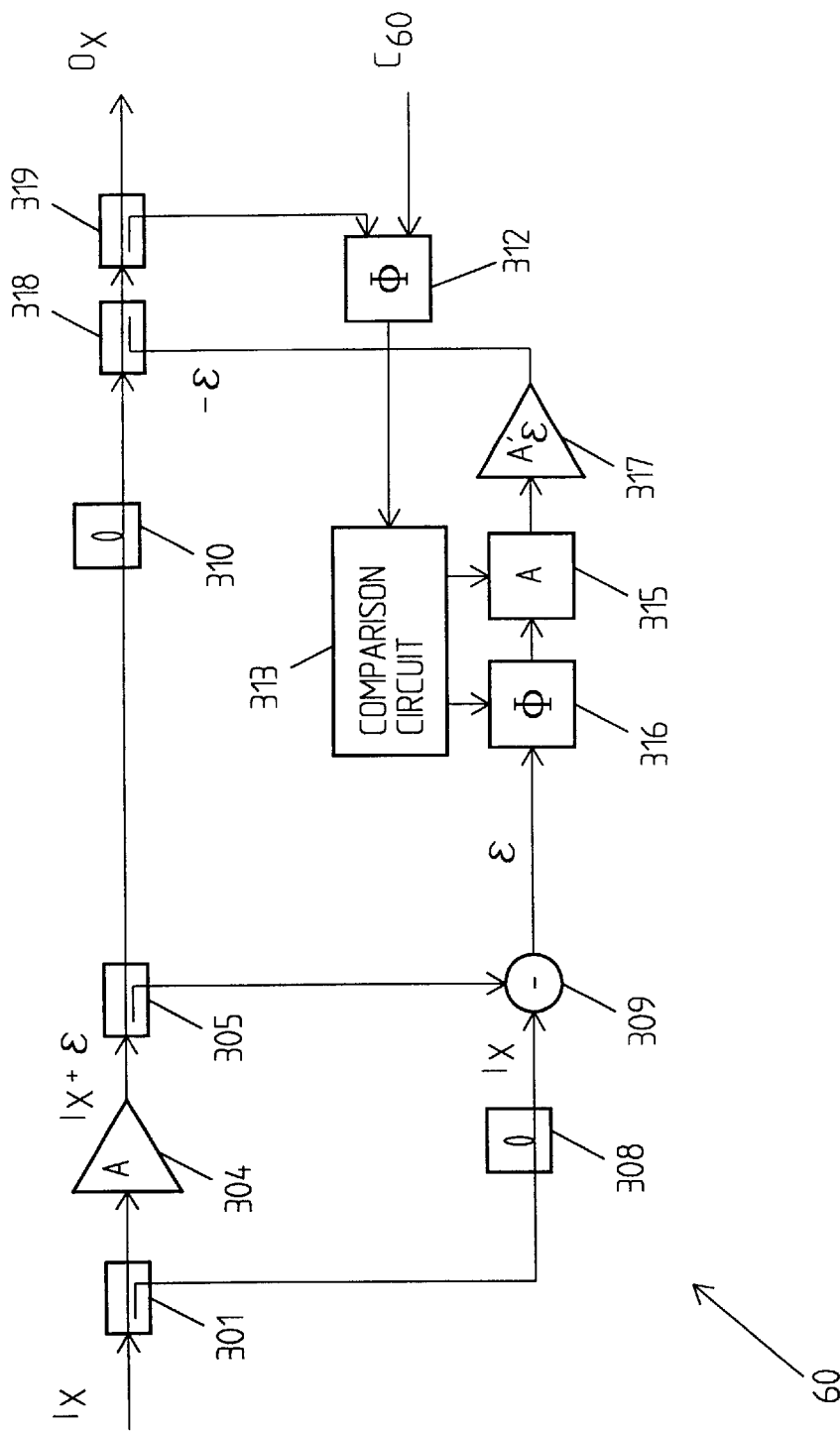
FIG. 6 shows an example of an amplifying means, FIG. 7 schematically illustrates an active multi-carrier power antenna comprising a 2×2 array of antenna elements.

FIG. 6 also shows the functioning for one amplifying means. In power splitting means 301 an input signal $I_x$ is duplicated to take an upper path and a lower path. On the upper path $I_x$ is provided to the main amplifier 304 thus providing an amplified signal $I_x+\epsilon$, i.e. an amplified signal containing an error which in turn is duplicated in power splitting means 305 from where it is provided to delay means 310 and to combining means 309.

The input signal $I_x$ is also sent along another path (the lower path as illustrated in FIG. 6) in which it is delayed in delay means 308. The delayed signal $I_x$ output from delay means 308 is in combining means 309 combined with a signal $I_x+\epsilon$ output from power splitting means 305 from which it is subtracted, thus resulting in an error signal ϵ which is input to phase control means 316 and amplitude control means 315. The resulting signal is then provided to error amplification means 317 and the amplified error signal is in combining means 318 subtracted from the delayed signal $I_x+\epsilon$ resulting in an output signal $O_x$ which is output to antenna means. The signal is however also duplicated in power spitting means 319 providing an input to the phase shifter 312 to which an external control signal $C_{60}$ is provided. From phase shifter 312 a signal is provided to the comparison circuit 313 which controls the error phase control means 316 and error amplitude control means 315.

The thought with the external control signal $C_{60}$ is to introduce a correcting signal. This is obtained after adding the output signals from all the amplifying means. This is so since it is not obvious that the phase/amplitude comparison circuit 313 is capable of detecting the phase error before the adding has taken place. After the adding, the relationship between signal and non-linear terms is potentially higher and thus the error is easier to detect.

Figure 7:
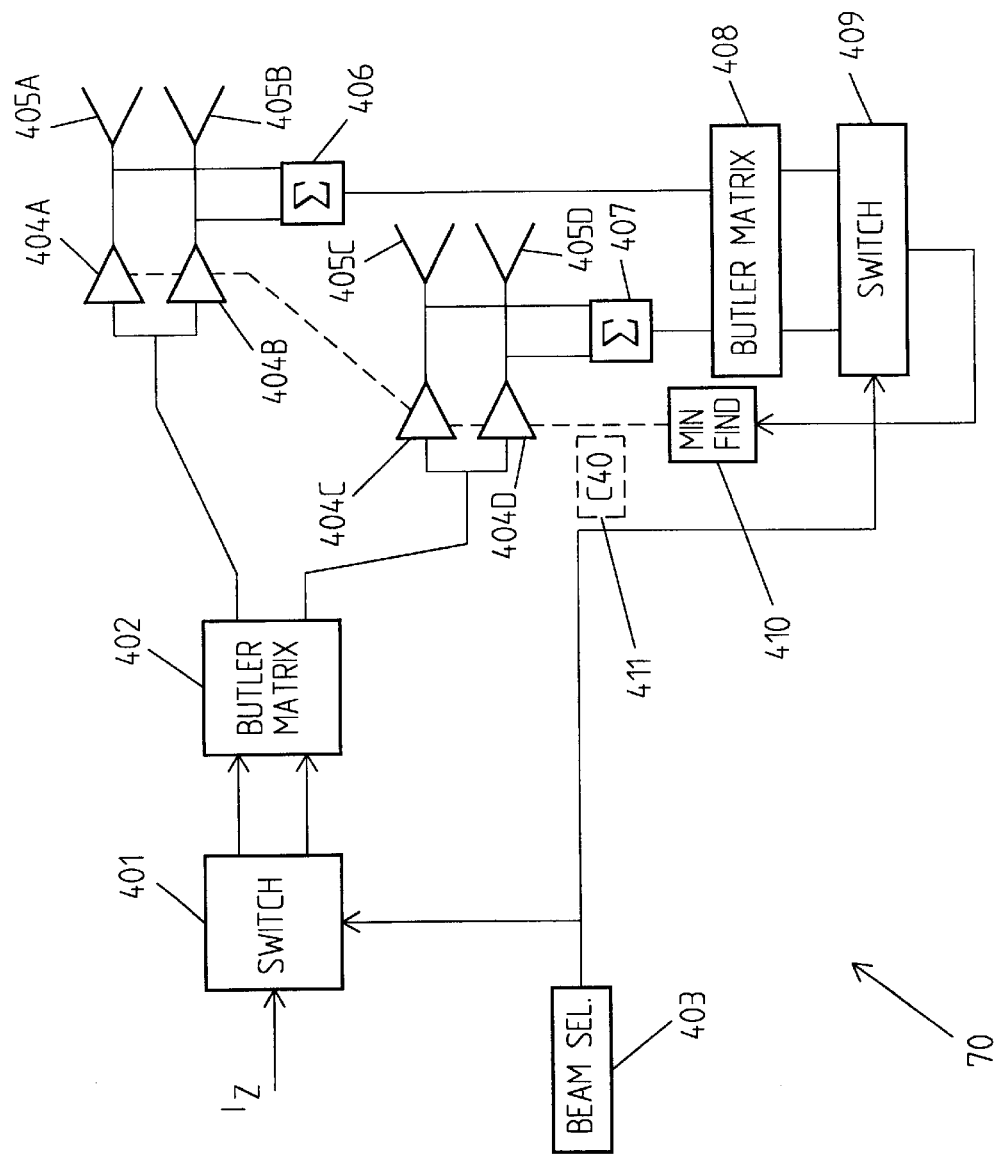
Figure 8:
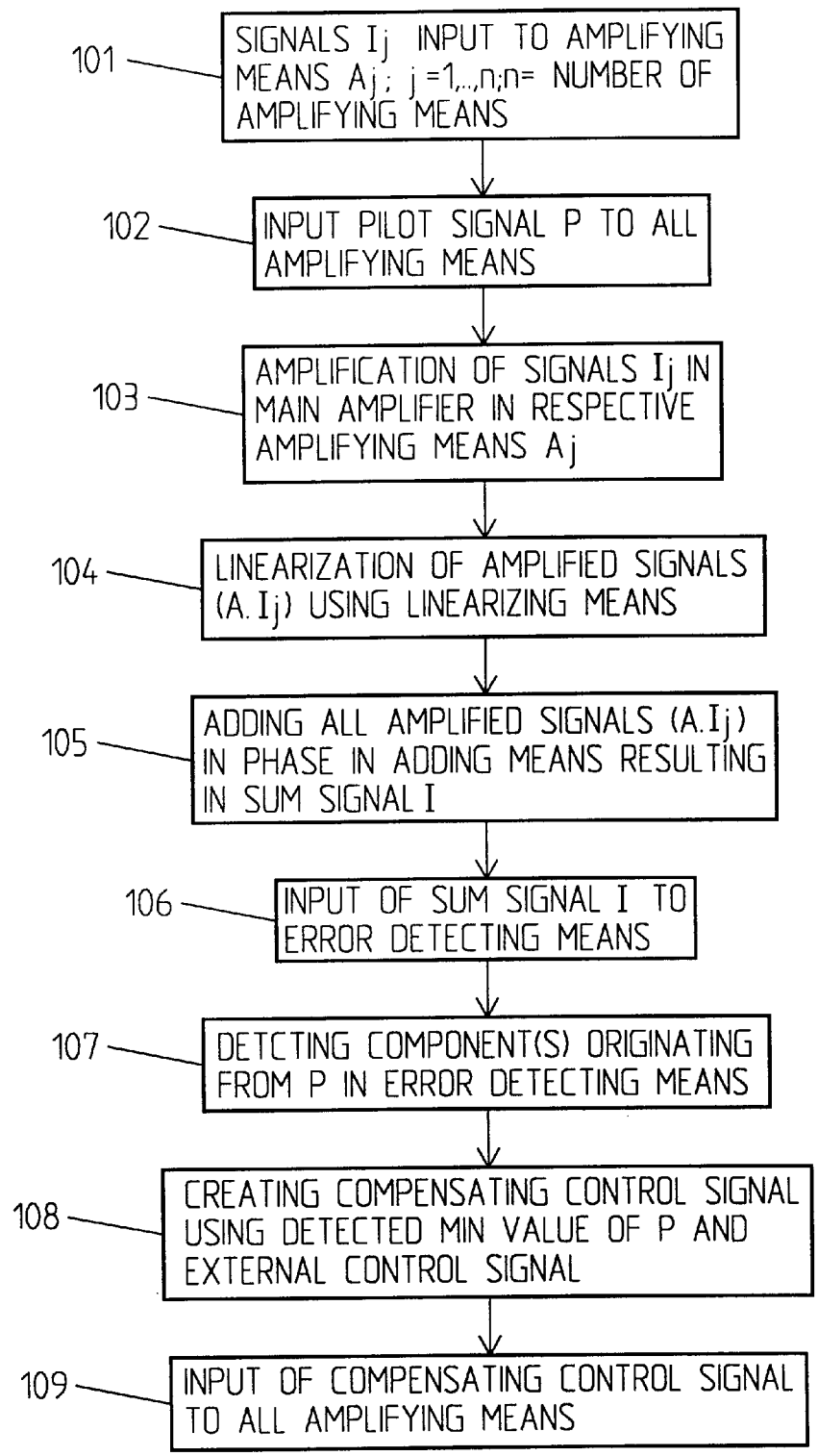
FIG. 8 is a schematically flow diagram illustrating controlling of the average phase error of a multi-carrier power amplifying arrangement for an array antenna.

In FIG. 7 an example of an implementation of the inventive concept on a 2×2 array antenna is disclosed. The functioning is the same for an k×1 array antenna wherein k and 1 are arbitrary integers.

The principle here is that the input signal $I_z$ is added in the same beam direction as it is sent out. Therefore the signals output from amplifying means are first added vertically using an ordinary addition and then, with the use of a Butler matrix, the output signal is selected with the same switch control means that controls the input signal of the antenna (beam selection). All the signals are added to find a mean value (a scalar value). This means that the problem is reduced to a one-dimensional problem which can be solved comparatively easily.

Thus input signal $I_z$ is provided to switch 401 in which a beam is selected via beam selection means 403. That means that one of two signals with one of two phases is obtained which is input to Butler matrix 402. The signals that can be output from the Butler matrix 402 have different phase. Amplifying means 404A, 404B are arranged vertically and to each of them an antenna means 405A, 405B are provided; here, as referred to earlier in the application the number of antenna elements can exceed the number of amplifying means. Horisontally displaced in relation thereto amplifying means 404C, 404D are provided to which antenna means 405C, 405D are provided. In adding means 406, 407 the signals are added vertically thus, in this case providing two sum signals which are input to Butler matrix 408. Via a switch control 409 a beam is selected via beam selecting means 403. A signal output from switching means 409 is used to find the minimum, 410, as referred to above. C40 relates to an external control signal, as discussed with reference to the other embodiments, which is provided via phase shifter 411. In other aspects the functioning is the same as for the other described embodiments.

According to the invention a number of signals $I_j$ are input to amplifying means $A_j$ wherein j indicates the particular amplifying means, there being, in this case, n amplifying means, 101. A pilot signal p is also input to all the amplifying means, 102. Each amplifying means contains a main amplifier in which the input signals $I_j$ are amplified, 103. This discuss more thoroughly earlier in the application, the amplified signals, here called A $I_j$, are liniearized using the convenient linearizing means, 104. Then all the amplified signals A×$I_j$ are added in phase more cohorently, in adding means resulting in a sum signal I105. The sum signals I is then input to error detecting means, 106 in which components originating from the pilot signal is detected. The pilot signal may (as also referred to earlier in the application) relate to a specific frequency(frequencies), it may also be a so called CDMA-coded signal, 107. Using the detected minimum value of the pilot signal for which an external control signal is used, a compensating control signal is created, 108. The compensating control signal is input to all amplifying means, 109.

According to the invention the errors are easier to detect since the detection is done after the signals have been added which is easier than if individual detectors are used for detection purposes since the signal amplitude is multiplied by the number of elements.

The invention is of course not limited to the illustrated embodiments but can be varied in a number of ways without departing from the scope of the claims.

What is claimed is:

1. A multi-carrier power amplifying arrangement comprising:
   a number of amplifying means each of which comprises:
      signal input means,
      signal output means,
      a main amplifier and
      means for linearizing the amplifying means;
   sampling means for sampling all amplifier outputs prior to error detection;
   adding means for adding the amplifier output samples together in phase to produce a sum signal; and
   error detecting means for detecting an average phase error from the sum signal; and
   means for providing a compensating control signal determined by the average phase error, to each said amplifying means to compensate for the average phase error.

2. An arrangement according to claim 1, wherein a reference signal is provided to each amplifying means and the reference signal is used to detect the average phase error of the amplified signals.

3. An arrangement according to claim 2, wherein the reference signal comprises a pilot signal which is input to the amplifying means and to the error detecting means and the detecting means comprises means for detecting at least one component originating from the pilot signal, the result being used to provide the compensating control signal.

4. An arrangement according to claim 2, wherein the reference signal is injected before the main amplifier of each amplifying means.

5. An arrangement according to claim 2, wherein the reference signal is injected after the main amplifier of each amplifying means.

6. An arrangement according to claim 1, wherein an externally controlled control signal is provided to the error detecting means to provide the compensating control signal.

7. An arrangement according to claim 6, wherein the compensating control signal is a signal with an externally controlled phase.

8. An arrangement according to claim 7, wherein the externally controlled signal is provided to the error detecting means via a digitally controlled phase shifter.

9. An arrangement according to claim 1, wherein the linearizing means comprises a feed forward loop for linearizing the amplified signal of the amplifying means.

10. An arrangement according to claim 9, wherein there is one feed forward loop for each amplifying means.

11. An arrangement according to claim 1, wherein the signals output from the respective amplifying means are provided to at least one antenna element, which antenna elements are arranged to form an array antenna.

12. An arrangement according to claim 11, wherein the number of antenna elements are arranged in a linear array.

13. An arrangement according to claim 11, wherein the number of antenna elements are arranged in a two dimensional array.

14. An arrangement according to claim 11, wherein n×m amplifying means are arranged in n rows and m columns, and at least n×m antenna elements are provided.

15. An arrangement according to claim 14, wherein the adding means include m/n first adding means in which the signals output from the amplifying means are added in phase columnwise/rowwise and a second Butler matrix in which the added signals from the m/n first adding means respectively are added.

16. An arrangement according to claim 15, wherein a first switching means and a first Butler matrix are provided for selecting an input beam with one of a number of different phases, for each phase a number of amplifying means and antenna elements being provided.

17. An arrangement according to claim 15 wherein to the second Butler matrix a second switching means is provided for selecting an output beam.

18. An arrangement according to claim 17, further comprising means for finding the minimum of the signal output from the second switching means, the result being used to provide the compensating control signal.

19. An arrangement according to claim 1, wherein the amplitude error is compensated for.

20. An arrangement according to claim 1, wherein substantially the entire arrangement is realized as a Radio Frequency Application Specific Integrated Circuit (RFASIC).

21. An arrangement according to claim 1, wherein the error detecting means comprises a phase detector and an amplitude detector.

22. An array antenna comprising:
   a number of antenna elements coupled with a number of amplifying means for amplification of input signals which then are provided to the antenna elements, each of said amplifying means including
      a main amplifier and means for linearizing the amplifying means, and further including:
   signal sampling means for sampling outputs of each said amplifying means;
   signal adding means for adding the amplified signals output, from the amplifying means, in phase and
   error detecting means for detecting an average phase error of the amplified signals and for determining a compensating control signal; said compensating control signal being provided to each of said amplifying means to control the average phase error.

23. An array antenna according to claim 22, wherein a pilot signal is input to each amplifying means and is detected in the error detecting means thus providing an estimation of the average phase error.

24. An array antenna according to claim 23, wherein at least one component originating from the pilot signal output from the amplifying means is detected.

25. An array antenna according to claim 22, wherein an externally controlled signal is provided to the error detecting means to provide the compensating control signal.

26. An array antenna according to claim 22, wherein the amplitude error is compensated for.

27. An array antenna according to claim 22, wherein the antenna elements are arranged in a linear array.

28. An array antenna according to claim 22, wherein the antenna elements are arranged in a two dimensional array, and there are n×m amplifying means in n rows and m columns and at least n×m antenna elements.

29. An array antenna according to claim 28, wherein for each row or for each column of amplifying means adding means are provided in which the amplified signals in a row or a column are added and the resulting sum signals are added in a Butler matrix.

30. An array antenna according to claim 29, wherein a switch is provided to select one of the beams provided by the Butler matrix and means for finding the minimum of the selected beam using a varying external control signal are provided, and the resulting average value is used to control the amplifying means.

31. A method of controlling the average phase error of a multicarrier power amplifying arrangement for an array antenna, said amplifying arrangement including a number of amplifying means, comprising the steps of:

providing an input signal to each of said amplifying means, sampling outputs of each of said amplifying means prior to error detection;

adding the amplifier output samples together in phase to generate a number of sum signals, detecting at least the average phase error of the sum signals, using the detected average phase error to provide a compensating control signal, and providing the compensating control signal to each amplifying means to control the average phase error.

* * * * *